United States Patent
Olesen et al.

(10) Patent No.: US 8,451,609 B2
(45) Date of Patent: May 28, 2013

(54) COOLING DEVICE FOR A PLURALITY OF POWER MODULES

(75) Inventors: Klaus Kristen Olesen, Soenderborg (DK); Lars Paulsen, Hollingstedt (DE); Jens Klinghagen, Munkwolstrup (DE)

(73) Assignee: Danfoss Silicon Power GmbH, Schleswig (DE)

( * ) Notice: Subject to any disclaimer, the term of this patent is extended or adjusted under 35 U.S.C. 154(b) by 253 days.

(21) Appl. No.: 12/990,007

(22) PCT Filed: Apr. 27, 2009

(86) PCT No.: PCT/DE2009/000561
§ 371 (c)(1),
(2), (4) Date: Oct. 28, 2010

(87) PCT Pub. No.: WO2009/132620
PCT Pub. Date: Nov. 5, 2009

(65) Prior Publication Data
US 2011/0044001 A1    Feb. 24, 2011

(30) Foreign Application Priority Data
May 2, 2008    (DE) .................... 10 2008 021 917

(51) Int. Cl.
*H05K 7/20*    (2006.01)
*F28F 7/00*    (2006.01)

(52) U.S. Cl.
USPC .................................... 361/699; 165/80.4

(58) Field of Classification Search
USPC ......................................................... 361/699
See application file for complete search history.

(56) References Cited

U.S. PATENT DOCUMENTS

| | | | |
|---|---|---|---|
| 5,394,299 A | 2/1995 | Chu et al. | |
| 5,841,634 A | 11/1998 | Visser | |
| 6,084,771 A | 7/2000 | Ranchy et al. | |
| 6,542,365 B2 | 4/2003 | Inoue | |
| 7,027,302 B2 * | 4/2006 | Inoue | 361/699 |
| 7,231,960 B2 | 6/2007 | Sakai | |
| 7,245,493 B2 | 7/2007 | Inagaki et al. | |
| 7,248,478 B2 * | 7/2007 | Inoue | 361/699 |
| 7,965,508 B2 * | 6/2011 | Yamamoto et al. | 361/699 |
| 8,151,868 B2 * | 4/2012 | Inagaki | 165/80.4 |
| 2003/0015314 A1 | 1/2003 | Akselband | |

(Continued)

FOREIGN PATENT DOCUMENTS

| | | |
|---|---|---|
| DE | 19956565 A1 | 5/2001 |
| DE | 103 58 641 A1 | 9/2004 |

(Continued)

OTHER PUBLICATIONS

PCT Search Report for Serial No. PCT/DE2009/000561 dated Sep. 1, 2009.

*Primary Examiner* — Gregory Thompson
(74) *Attorney, Agent, or Firm* — McCormick, Paulding & Huber LLP

(57) ABSTRACT

The invention relates to a cooling device for a plurality of power modules (16), comprising a heat-conducting body (15) through which a coolant flows. The cooling device comprises external cooling ribs (14) on a first housing shell of the body through which a coolant flows for receiving the plurality of power modules adjacent to each other. Each individual cooling rib is aligned to come into fixed heat-conducting contact on at least one upper or lower side of one of the plurality of power modules, and the housing shell, on the inner side in the region of the respective cooling rib(s), comprises means for the fluidic communication with the volume of the coolant in the inside the body through which the coolant flows.

12 Claims, 5 Drawing Sheets

U.S. PATENT DOCUMENTS

| | | |
|---|---|---|
| 2006/0120047 A1* | 6/2006 | Inoue .......................... 361/699 |
| 2006/0266496 A1 | 11/2006 | Edward et al. |

FOREIGN PATENT DOCUMENTS

| | | |
|---|---|---|
| DE | 10358641 A1 | 9/2004 |
| DE | 69826927 T2 | 10/2005 |
| DE | 102005058782 A1 | 8/2007 |
| EP | 0514840 A2 | 11/1992 |
| EP | 1 113 496 A | 7/2001 |
| EP | 1 815 514 B1 | 11/2005 |
| WO | WO 2006/056199 A1 | 6/2006 |

* cited by examiner

COOLING DEVICE FOR A PLURALITY OF POWER MODULES

CROSS REFERENCE TO RELATED APPLICATIONS

This application is entitled to the benefit of and incorporates by reference essential subject matter disclosed in International Patent Application No. PCT/DE2009/000561 filed on Apr. 27, 2009 and German Patent Application No. 10 2008 021 917.7 filed May 2, 2008.

FIELD OF THE INVENTION

The invention concerns a cooling device for a plurality of power modules according to the preamble of the main claim.

BACKGROUND OF THE INVENTION

In cooling devices as known from, for example, DE 103 58 641 A1, the embodiment of the cooler is very expensive, therefore cost intensive, and the assembly of the individual modules is complicated. Further, here the problem occurs that the cooling effect is not distributed in a uniform manner over all modules.

An alternative, that of direct cooling, has the disadvantage that a sealing of the water transferring areas in the vicinity of the electronics is required, and that the operating conditions with long operating times of the electronics and the comprehensive damage that can result from an electronics failure have meant that until now the risk of possible leakages in the state of the art devices have most frequently prevented the use of an open water cooler. The classic method with a cooling plate only permits the planar arrangement of modules and thus requires a substantially larger base than a stacked design. Further, also the module assembly is expensive here.

U.S. Pat. No. 6,542,365 B2 describes cooling hoses with elastic sections, semi-conductor devices being retained between middle and end sections of the cooling hoses. These complex structures involve increased leakage risks, as the coolant channels are often bent and exposed to mechanical influences. Due to their complexity, these devices can only be manufactured at high costs.

Finally, EP 1 815 514 B1 of the applicant should also be mentioned, which concerns a flow distribution module, whereby substrates from the power modules are arranged in hollows of the housing. Special inlet distributors and outlet distributors provide flow connections. Due to the identical geometry of the modules, they have the same flow resistance, so that at certain points different flows can occur in several modules.

SUMMARY OF THE INVENTION

The invention is therefore based on the task of providing a cooling device that permits a stacked design of a plurality of power modules in a space-saving and easily assembled manner and which at the same time permits a uniform cooling performance on all modules in a safe manner without the risk of leakages.

In particular the fact that on one side the cooling device is provided with cooling fins for the adjacent accommodation of the plurality power modules, each cooling fin being provided for making a secure, heat conducting contact to at least the upper or lower side of one of the plurality of power modules, permits a very space-saving arrangement, which can, when the middle cooling fins are pressed against an upper side of one power module and against the lower side of an adjacent power module, hold said modules in a particularly advantageous manner. In this connection, it must be considered that of course each of the outer fins will only cool one power module and that power modules can also be arranged so that the upper sides are aligned with the upper sides and the lower sides are aligned to the lower sides, if it is at all possible to clearly define the upper and lower sides of power electronics.

The pressing force is applied to the power electronic modules by means of a wedge, so that it becomes necessary to make a mechanical support, particularly of the outer fins, as it can, for example, be realised by means of support fins, which are not in direct contact with power electronic modules, but protect them against outwardly bending at right angles to the outer fin(s).

Further, the simple, stack-shaped arrangement of the modules enables the realisation of a simple, low-inductance bus, and a common, mechanical protection of the modules, and of the wedges, against slipping.

Further, the advantage occurs that the sealing for the water cooling on the side facing away from the modules can be distant from the electronic components, so that the insertion of several sealing layers is possible. Still a compact, space-saving design with a simple assembly occurs, as all module interfaces are clearly visible.

The parallel arrangement ensures an optimisable coolant distribution that can be further optimised by plastic inserts in the support area of the cooling device that carries the fins. Since the coolant enters each cooling cell with the same temperature, a homogenous cooling is obtained, when compared to the arrangements in the state of the art, in which the coolant flows through several series-connected cooling devices.

In this case, adjacent arrangement of the stack modules means that they are aligned parallel to each other in a row, their flat sides facing each other. Advantageously, in this connection the fins have approximately the same dimensions as a power module. However, due to the inserts that are preferably provided for channel forming walls, the fins are made thicker. A protrusion over the dimensions of the power module would make assembly somewhat more difficult; on the other hand; however, in certain cases this will mechanically protect the connections in an advantageous manner.

Wedges, which are advantageously provided to correspond to guiding rails in the power modules, and which can be fixed by an final support that can be fitted across all fins by means of screws, can provide a heat conductive, secure contact of the power modules in the cooling arrangement. In this connection, the material of the wedges can, like the material of the modules, be adapted to the expansion of the cooling device, in particular that of the basic support carrying the fins.

The individual fins can be made to be detachable, for example by screw-fixing, or they can be an integral part of a cover of a water tank, and in a further preferred embodiment the fins can be hollow inside to accommodate plates forming water channels. However, they can also accommodate heat pipes or be made of a particularly conductive material.

Fixing the modules to the three-dimensional cooling member by means of pressing on a TIM (Thermal Interface Material) layer is preferred; however, also fixing by means of gluing, soldering or pressure sintering can be used. For this purpose, suitable fitting materials and coatings are available, which are known from the field of soldering or pressure sintering, that is, an AlSiC cooling member with an Ni-coating or surfaces suitable for pressure-sintering. Such a cohesive connection would provide particularly advantageous heat conduction in relation to the previously described TIM layer, and is thus particularly suited for applications in which particularly high cooling performances of the modules are desired.

As can be seen, a soldered embodiment variant does not require protection of the modules by a moulded element, as a wedge pressing is not required.

DESCRIPTION OF THE DRAWINGS

Further advantages and features appear from the following description of preferred embodiments. The drawings show.

DETAILED DESCRIPTION OF THE PREFERRED EMBODIMENTS

Figure 1:
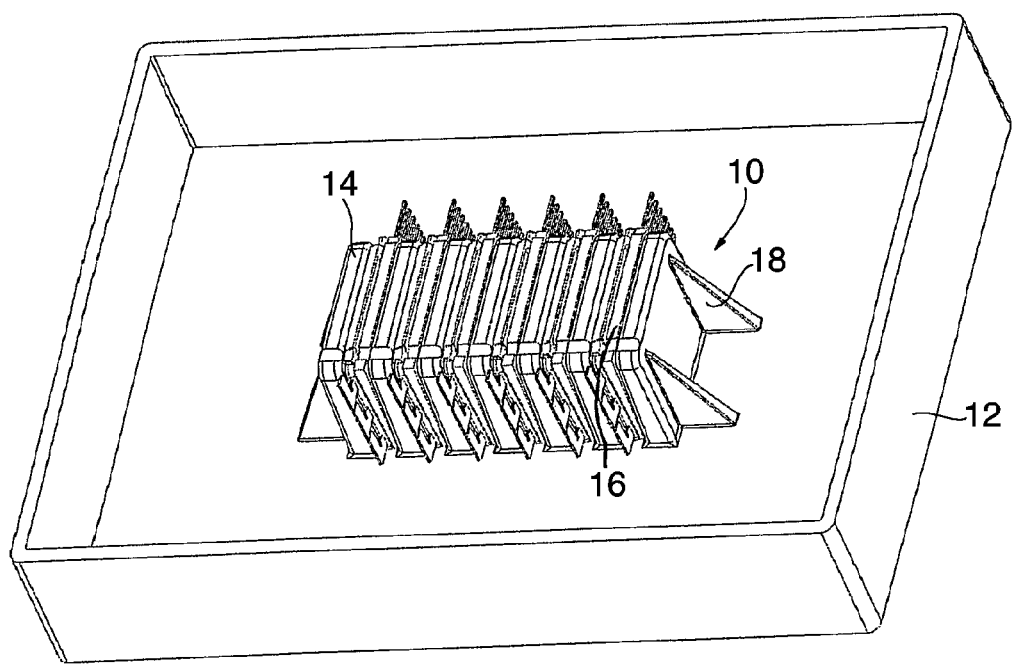
FIG. 1 shows the design according to the invention in the assembled state.

The outer frame 12 visible around the cooling device 10 in FIG. 1 serves for the accommodation of further components.

The device, and in particular the individual cooling fins 14, which extend parallel to and are arranged adjacent to each power module 16, have approximately the same height as the power modules in order to contact all areas in which heat can occur.

For example, the drawing shows six power modules 16 surrounded by seven cooling fins 14, each outer cooling fin 14 also comprising a support edge 18. Aluminium is suggested as a material for the cooling body, but also other materials can be imagined.

Figure 2:
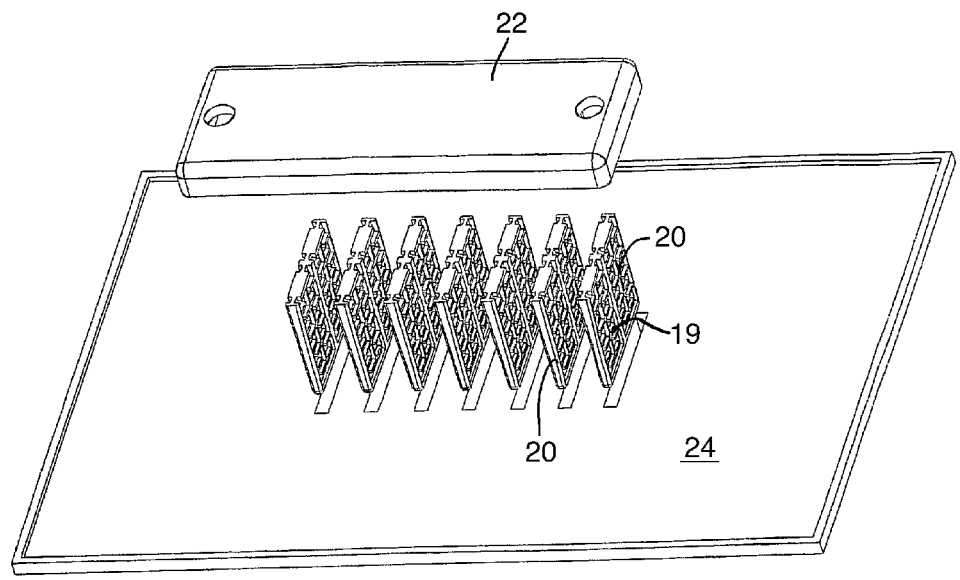
FIG. 2 shows the features not visible in FIG. 1, because they are provided on the inside, namely the plates inserted in the individual cooling fins from below.

Not visible in FIG. 1 are the features shown in FIG. 2, namely the plates 20 inserted into the individual cooling fins from below for forming coolant channels, and a cover support 22 arranged above the fins and having screw bolt connections for fixing the wedges.

Clearly visible on a first housing shell 24 of the body 15, through which the coolant flows, the cooling device comprises several cooling fins 14 for the accommodation of the plurality of power modules 16 (preferably one between any two cooling fins 14), each cooling fin 14 being adapted for making a secure, heat conductive contact to the upper or lower side of at least one of the plurality of power modules 16, the housing shell having on its inside, in the area of the individual cooling fin(s) 14, a means for fluid communication with the volume of the coolant located inside the body, and through which the coolant flows.

Figure 3:
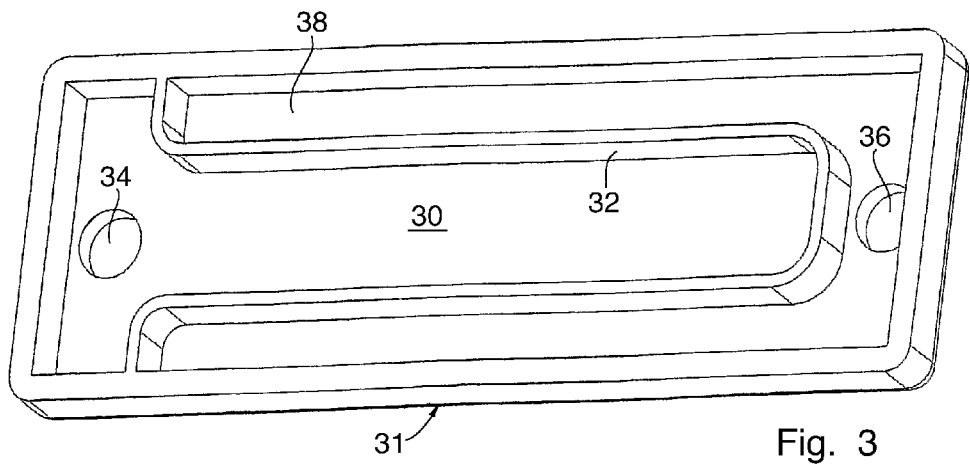
FIG. 3 shows a bottom part that can serve as coolant inlet and outlet.

Finally, FIG. 3 shows an example of a bottom part, a second housing shell 31 that serves the coolant inlet and outlet. By means of walls 32 protruding into the inner space, the inlet/outlet 34 arranged on the opposite side is in fluid communication with a central area 30 of the cover, while being separated from an outer area 38. The outer area 38 that is connected to the outlet/inlet 36 on the other short side of the housing shell 31 extends approximately up to the end of both longitudinal sides. Fluid communication between the outer area 38 and the central area 30 is only possible through the inwardly hollow cooling fins 14, which overlap both areas. Through structures of the plates 20 inside the cooling fins 14, the coolant is additionally led through all areas of the cooling fins 14, before it can leave the cooling fins again.

Figure 4:
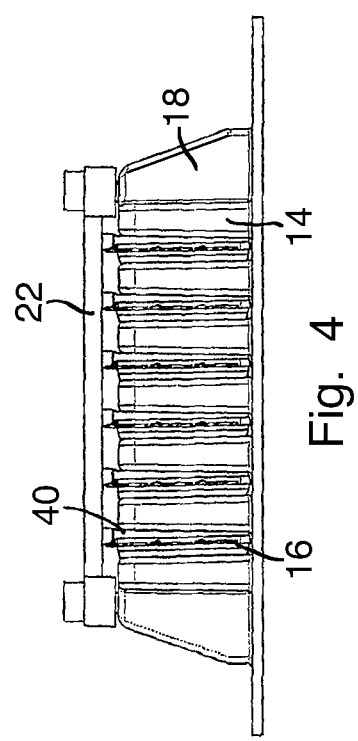
Figure 6:
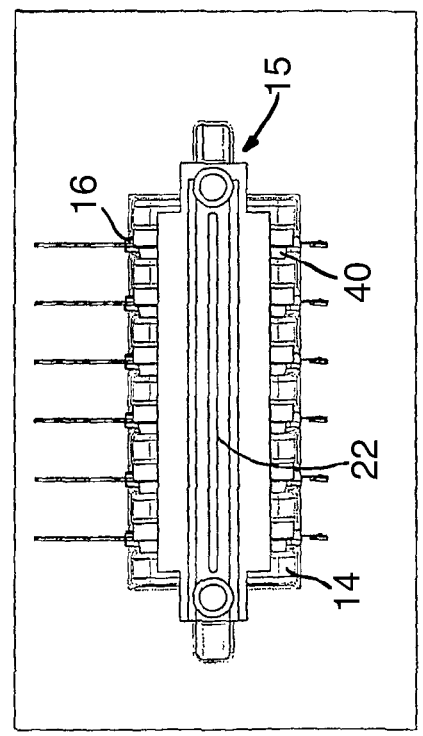
Figure 7:
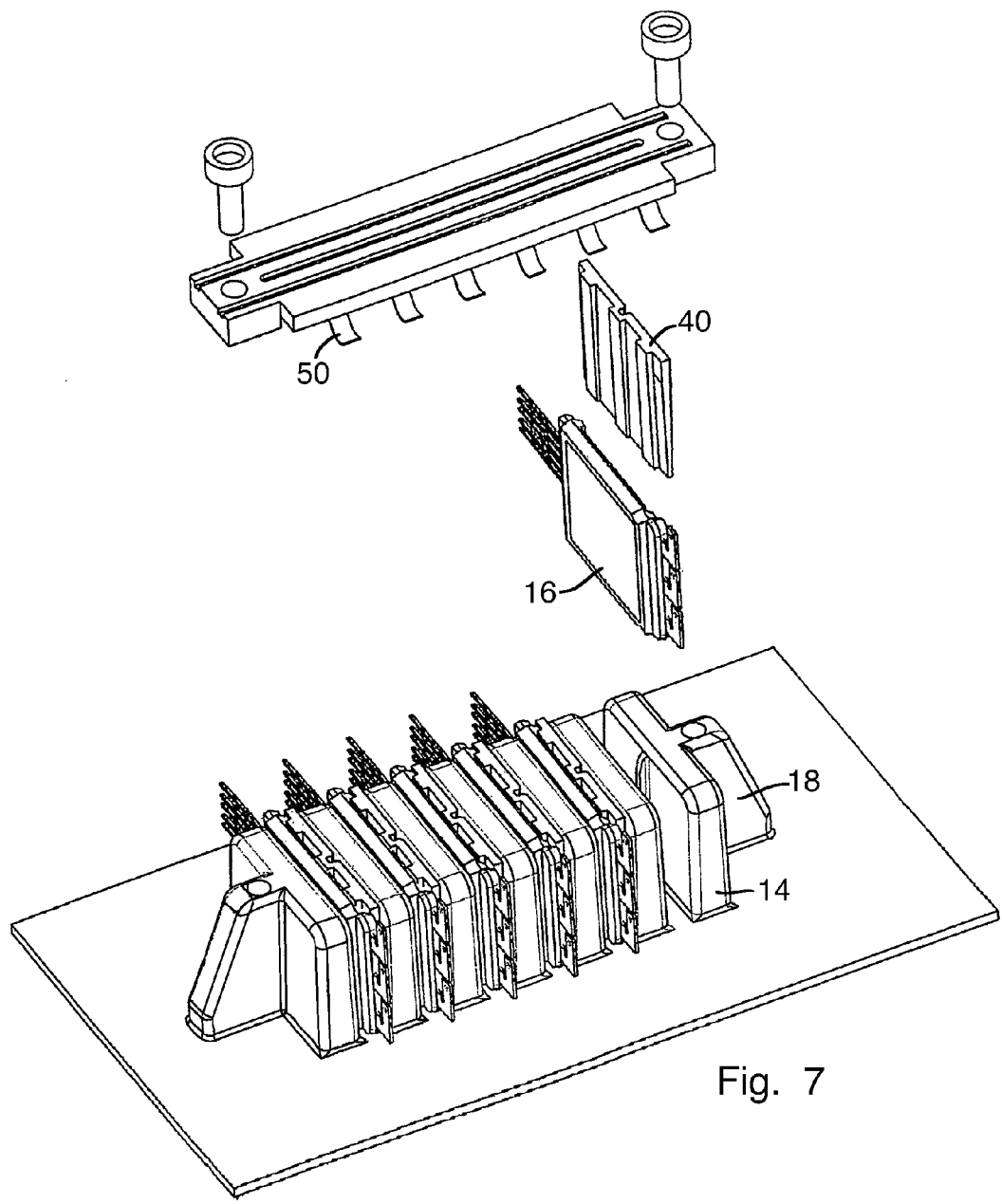
FIG. 7 is a schematic view of an assembly of a power module, in which an outer power module is inserted into a remaining free space between the penultimate fin and the outer fin, and subsequently a wedge is inserted from above and a support for the fixing is mounted by means of screws. From below, further a plate forming a channel is inserted into the cooling fin.

FIG. 4 shows a side view of the design according to the invention, the support 22 holding the wedges 40 being clearly visible.

Figure 5:
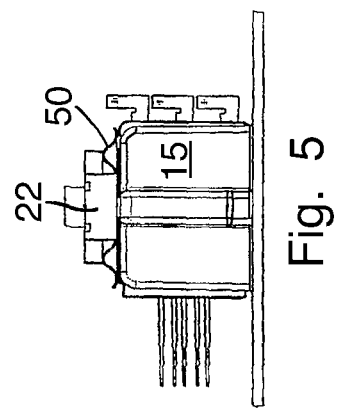
FIGS. 4, 5 and 6 show the design according to the invention in a side view, a front view and a top view, in which the support fixing the wedges is clearly visible.
Figure 8:
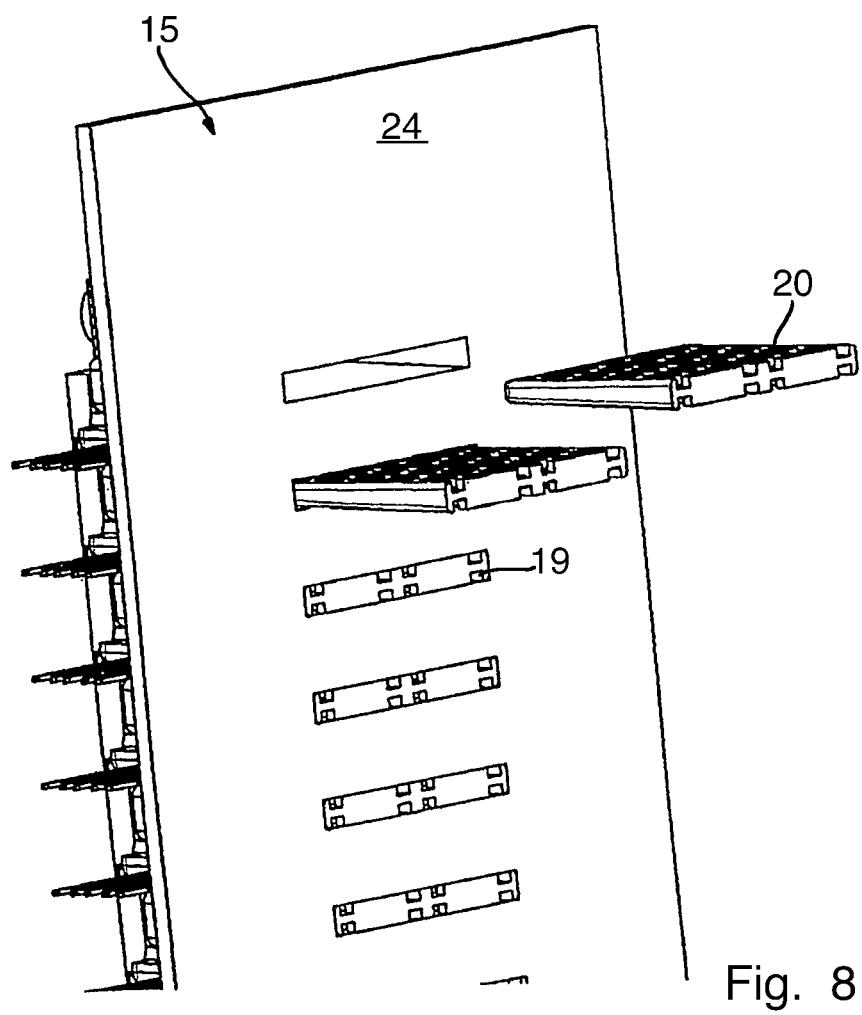
FIG. 8 is a view of the rear that is not shown in FIG. 7, in which the insertion of structured, suitable inserts in the hollows of the cooling fins is shown.

In FIG. 5 the assembly is shown schematically, an outer power module being inserted into a remaining free space between the penultimate fin and the outer fin. Subsequently, a wedge 40 is inserted from above and a support 22 for the fixing is mounted by means of screws. Under the support, spring elements 50 are visible; each resiliently pressing a wedge 40 inwards, so that the thermal contact with the cooling fins is secured. From below, as shown in FIG. 2, a plate 20 forming channels is inserted into the cooling fin (FIG. 8).

The wedges provided adjacent to the power modules for clamped fixing of the encapsulated power modules are provided with a spring reaction to effect a resilient constant pressing force, for example by means of a bending of a plane section during manufacturing. As well as by gluing or clamping, the modules can also be fixed by means of soldering, welding, pressure sintering or similar techniques. It is also possible to place resilient sections direct on the cooling fins by means of one of these techniques.

Thus, for a plurality of power modules, the cooling device has in its simplest design a heat conductive body, through which a coolant flows, the cooling device having on one side, for the adjacent accommodation of the plurality of power modules, corresponding cooling fins, each individual cooling fin being adapted for making a secure, heat conductive contact with at least the upper or lower side of one of the power modules. That is, preferably inner cooling fins are adapted for making a secure, heat conductive contact with both the upper or lower side of one of the plurality of power modules and with a further upper or lower side of an adjacent power module of the plurality of power modules.

In a preferred embodiment, the power modules are aligned parallel to each other to be arranged in a stack, so that the electrical connections of the power modules protrude laterally between the fins.

Symmetry of the geometry of the cooling fins is preferred, with a height and a width over a base housing, through which coolant flows, the height and width corresponding to the dimensions of the individual power modules.

In this connection, individual cooling fins can be detachably fixed to the cooling device and be provided with separate coolant inlets and outlets for the coolant channels 17.

Further, the cooling fins 14 can be hollow on the inside for the accommodation of an insert plate having a relief that forms flow paths, in particular for the forced guiding of coolant through the fins.

Each outer cooling fin of a row of adjacent cooling fins can be provided with cross-strut fins for the absorption of clamping forces of the power modules between the fins. In this connection, it can be imagined that several rows of cooling fins are provided. Finally, it is suggested that between any two cooling fins, wedges are used adjacent to the power modules for the clamping of encapsulated power modules during mounting. These wedges can be made of plastic or of a material with good heat conductivity.

While the present invention has been illustrated and described with respect to a particular embodiment thereof, it should be appreciated by those of ordinary skill in the art that various modifications to this invention may be made without departing from the spirit and scope of the present.

What is claimed is:

1. A cooling device for cooling a plurality of electrical power modules with a heat conductive body having channels permitting a coolant flow, wherein
   on one side, the body has fin-shaped cooling elements,
   each fin-shaped cooling element being adapted for a heat conducting contact with at least the upper or lower side of one of the plurality of electrical power modules to be cooled, and
   on another side, the body comprises at least one inlet and outlet that are connectable to the coolant flowing through the inside of the channels.

2. The cooling device according to claim 1, wherein inner fin-shaped cooling elements are adapted for entering a secure heat conducting contact with both the upper or lower side of one of the plurality of power modules and with an additional upper or lower side of an adjacent one of the plurality of power modules.

3. The cooling device according to claim 1, wherein the power modules are aligned parallel to each other in a stack, so that the electrical connections of the power modules protrude laterally between the fin-shaped cooling elements.

4. The cooling device according claim 1, wherein individual fin-shaped cooling elements are detachably fixed to the cooling device and provided with separate coolant inlets and outlets.

5. The cooling device according to claim 1, wherein each fin-shaped cooling element has a height and width, through which the coolant flows, said height and width corresponding to the individual dimensions of the power modules.

6. The cooling device according to claim 1, wherein internally the fin-shaped cooling elements are hollow for the accommodation of an insert plate provided with a relief that forms flow paths for the forced guiding of coolant through the fin-shaped cooling elements.

7. The cooling device according to claim 1, wherein each outer fin-shaped cooling element of a row of adjacent fin-shaped cooling elements is provided with cross-strut fins for the absorption of clamping forces of the power modules between the fin-shaped cooling elements.

8. The cooling device according to claim 1, wherein, between any two fin-shaped cooling elements, wedges are provided adjacent to the power modules for wedging the power modules encapsulated between the any two fin-shaped cooling elements with a spring reaction to effect a resilient, constant pressing force.

9. The cooling device according to claim 8, wherein the wedges provided between any two fin-shaped cooling elements adjacent to the power modules for wedging the power modules encapsulated between the any two fin-shaped cooling elements are provided with a common support that comprises at least one leaf spring or flexible tongue, each providing a spring reaction in the insertion direction on at least one wedge to effect a resilient, constant pressing force.

10. The cooling device according to claim 8, wherein the wedges provided between any two fin-shaped cooling elements adjacent to the power modules are made of a material with a good heat conduction.

11. The cooling device according to claim 1, wherein the body includes a first housing shell carrying the fin-shaped cooling elements and wherein, for a parallel distribution to all fin-shaped cooling elements of the coolant with the same inlet temperature, a shell-like cover is provided to form the body of the cooling device together with the first housing shell, and the shell-like cover comprises a central, first flow area, defined by edges and provided in the middle of the shell-like cover, and a second flow area, arranged on the edge, wherein the shell-like cover covers inlets and outlets of all fin-shaped cooling elements formed in the first housing shell, whereby third flow areas arranged in the fin-shaped cooling elements effect a flow of coolant through all fin-shaped cooling elements, ensuring the same temperature of the flowing coolant for all fin-shaped cooling elements.

12. A cooling device for cooling a plurality of electrical power modules, the cooling device comprising:
   a heat conductive body including:
      a plurality of fin-shaped cooling elements arranged on one side of the heat conductive body, each fin-shaped cooling element having at least one channel formed therein for permitting a coolant flow; and
      at least one inlet and outlet formed on another side of the body, the at least one inlet and outlet being connectable to the coolant flowing through the inside of the channels formed in the plurality of fin-shaped cooling elements;
   wherein each fin-shaped cooling element of the plurality of fin-shaped cooling elements is adapted for a heat conducting contact with the upper or lower side of at least one of the plurality of electrical power modules being cooled.

* * * * *